(12) United States Patent
Lin et al.

(10) Patent No.: US 11,163,333 B2
(45) Date of Patent: Nov. 2, 2021

(54) HEAD-MOUNTED DISPLAY

(71) Applicant: HTC Corporation, Taoyuan (TW)

(72) Inventors: Sheng-Cherng Lin, Taoyuan (TW); Jui-Hsiang Lin, Taoyuan (TW)

(73) Assignee: HTC Corporation, Taoyuan (TW)

( * ) Notice: Subject to any disclaimer, the term of this patent is extended or adjusted under 35 U.S.C. 154(b) by 46 days.

(21) Appl. No.: 16/368,876

(22) Filed: Mar. 29, 2019

(65) Prior Publication Data

US 2020/0310488 A1 Oct. 1, 2020

(51) Int. Cl.
*G06F 1/16* (2006.01)
*H05K 5/02* (2006.01)
*H04N 5/74* (2006.01)

(52) U.S. Cl.
CPC .......... *G06F 1/163* (2013.01); *H04N 5/7491* (2013.01); *H05K 5/0221* (2013.01)

(58) Field of Classification Search
CPC ..... G06F 1/163; H05K 5/0221; H04N 5/7491
See application file for complete search history.

(56) References Cited

U.S. PATENT DOCUMENTS

| | | | | |
|---|---|---|---|---|
| 5,357,654 A | * | 10/1994 | Hsing-Chi | A42B 3/145 2/418 |
| 5,767,820 A | * | 6/1998 | Bassett | G02B 27/017 345/7 |
| 5,950,245 A | * | 9/1999 | Binduga | A42B 3/145 2/417 |
| 6,314,588 B1 | * | 11/2001 | Fang | A42B 3/145 2/183 |
| 6,708,376 B1 | * | 3/2004 | Landry | A42B 3/145 2/418 |

(Continued)

FOREIGN PATENT DOCUMENTS

| CN | 202086771 | 12/2011 |
|---|---|---|
| CN | 201643506 | 12/2016 |

(Continued)

OTHER PUBLICATIONS

"Office Action of Taiwan Related Application No. 108144809", dated Feb. 27, 2020, pp. 1-8.

(Continued)

*Primary Examiner* — Hung S. Bui
*Assistant Examiner* — Sagar Shrestha
(74) *Attorney, Agent, or Firm* — JCIPRNET

(57) ABSTRACT

A head-mounted display includes a wearing portion, a display body, a first strap, a second strap, an adjustment assembly, and a switching assembly. The display body is connected to the wearing portion. The first strap and the second strap are respectively connected to two opposite sides of the wearing portion. The first strap, the second strap, and the wearing portion define a wearing space, and the first portion of the first strap and the second portion of the second strap are overlapped with each other. The adjustment assembly is adapted to be coupled to the first strap and the second strap and is configured to adjust the degree of overlap of the first portion and the second portion to thereby change the wearing space. The switching assembly is disposed at the adjustment assembly to switch the adjustment assembly to a coupled state or a decoupled state.

25 Claims, 19 Drawing Sheets

(56) References Cited

U.S. PATENT DOCUMENTS

| | | | |
|---|---|---|---|
| 7,174,575 B1* | 2/2007 | Scherer | A42B 3/145 2/418 |
| 8,161,576 B2* | 4/2012 | Lemke | A42B 3/145 2/418 |
| 8,359,672 B2* | 1/2013 | Moelker | A42B 3/145 2/418 |
| 8,370,967 B2* | 2/2013 | Chen | A42B 3/145 2/418 |
| 8,578,521 B2* | 11/2013 | Rogers | A42B 3/08 2/417 |
| 9,408,437 B2 | 8/2016 | Goodman et al. | |
| 10,873,799 B2* | 12/2020 | Wang | H04R 1/028 |
| 2010/0050325 A1* | 3/2010 | Wang-Lee | A42B 3/145 2/418 |
| 2011/0191946 A1* | 8/2011 | Fang | A42B 3/145 2/418 |
| 2015/0059065 A1* | 3/2015 | Klotz | A42B 1/22 2/418 |
| 2015/0107006 A1* | 4/2015 | Chen | A42B 3/145 2/418 |
| 2016/0357250 A1* | 12/2016 | Kim | G02B 27/0176 |
| 2017/0315365 A1* | 11/2017 | Shen | G06F 3/0304 |
| 2017/0337737 A1* | 11/2017 | Edwards | F16M 13/04 |
| 2018/0306418 A1* | 10/2018 | Koyama | F21K 9/60 |
| 2018/0321707 A1* | 11/2018 | Hu | G02B 27/0176 |
| 2018/0364490 A1* | 12/2018 | Lin | G02B 27/02 |
| 2019/0037715 A1* | 1/2019 | Chen | H05K 5/0017 |
| 2019/0159354 A1* | 5/2019 | Zheng | A42B 1/24 |
| 2019/0196536 A1* | 6/2019 | Wang | G06F 1/163 |
| 2019/0220056 A1* | 7/2019 | Yan | G06F 1/163 |
| 2019/0339532 A1* | 11/2019 | Chang | G02B 27/0176 |
| 2019/0339736 A1* | 11/2019 | Chang | A42B 3/145 |

FOREIGN PATENT DOCUMENTS

| | | |
|---|---|---|
| CN | 106461942 | 2/2017 |
| CN | 107251547 | 10/2017 |
| CN | 207181820 | 4/2018 |
| CN | 207817308 | 9/2018 |
| CN | 207833110 | 9/2018 |
| EP | 3119082 | 1/2017 |
| EP | 3396973 | 10/2018 |
| TW | M281180 | 11/2005 |

OTHER PUBLICATIONS

"Office Action of Taiwan Counterpart Application," dated Jul. 18, 2019, p. 1-p. 6.

* cited by examiner

HEAD-MOUNTED DISPLAY

BACKGROUND OF THE INVENTION

Field of the Invention

The invention relates to a head-mounted display, and more particularly to a head-mounted display that may rapidly adjust wear size.

Description of Related Art

Virtual reality (VR) technology belongs to a new generation of display technology, which mainly combines computer graphics systems and various display and control devices to generate virtual 3D images. Virtual 3D images are mainly realized by VR glasses, and VR glasses are usually combined with a strap to form a head-mounted display for the user to wear.

In general, the strap of a head-mounted display requires an adjustable length of approximately twenty centimeters to accommodate the head size of different users. When the user wears the head-mounted display, the strap is gradually tightened until it conforms to the user's head size. In addition, when the user wants to take off the head-mounted display, the strap needs to be untied. This may result in lengthy adjustments if the user needs to fine-tune the tension of the strap and the wearing position. Therefore, how to improve the adjustment efficiency of the head-mounted display is an important development goal at present.

SUMMARY OF THE INVENTION

The invention provides a head-mounted display that may quickly adjust the wear size of a strap to achieve improved adjustment efficiency.

A head-mounted display of the invention includes a wearing portion, a display body, a first strap, a second strap, an adjustment assembly, and a switching assembly. The display body is connected to the wearing portion. The first strap and the second strap are respectively connected to two opposite sides of the wearing portion. The first strap, the second strap, and the wearing portion define a wearing space, and a first portion of the first strap and a second portion of the second strap are overlapped with each other. The adjustment assembly is adapted to be coupled to the first strap and the second strap and is configured to adjust a degree of overlap of the first portion and the second portion to thereby change the wearing space. The switching assembly is disposed at the adjustment assembly to switch the adjustment assembly to a coupled state or a decoupled state, wherein the adjustment assembly is coupled to the first strap and the second strap in the coupled state to drive the first strap and the second strap to move relative to each other, and the adjustment assembly is decoupled from the first strap and the second strap in the decoupled state such that the first strap and the second strap are free to move relative to the adjustment assembly.

Based on the above, in the head-mounted display of the invention, by adjusting the degree of overlap of the first strap and the second strap via the adjustment assembly, the wearing space is changed to fit the head shape and size of a user, and at this point the adjustment assembly is in the coupled state. In addition, the switching assembly may switch the adjustment assembly from the coupled state to the decoupled state. In the decoupled state, the adjustment assembly is decoupled from the first strap and the second strap, such that the first strap and the second strap are free to move relative to the adjustment assembly, such that the user may quickly adjust the size of the wearing space to achieve improved adjustment efficiency.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
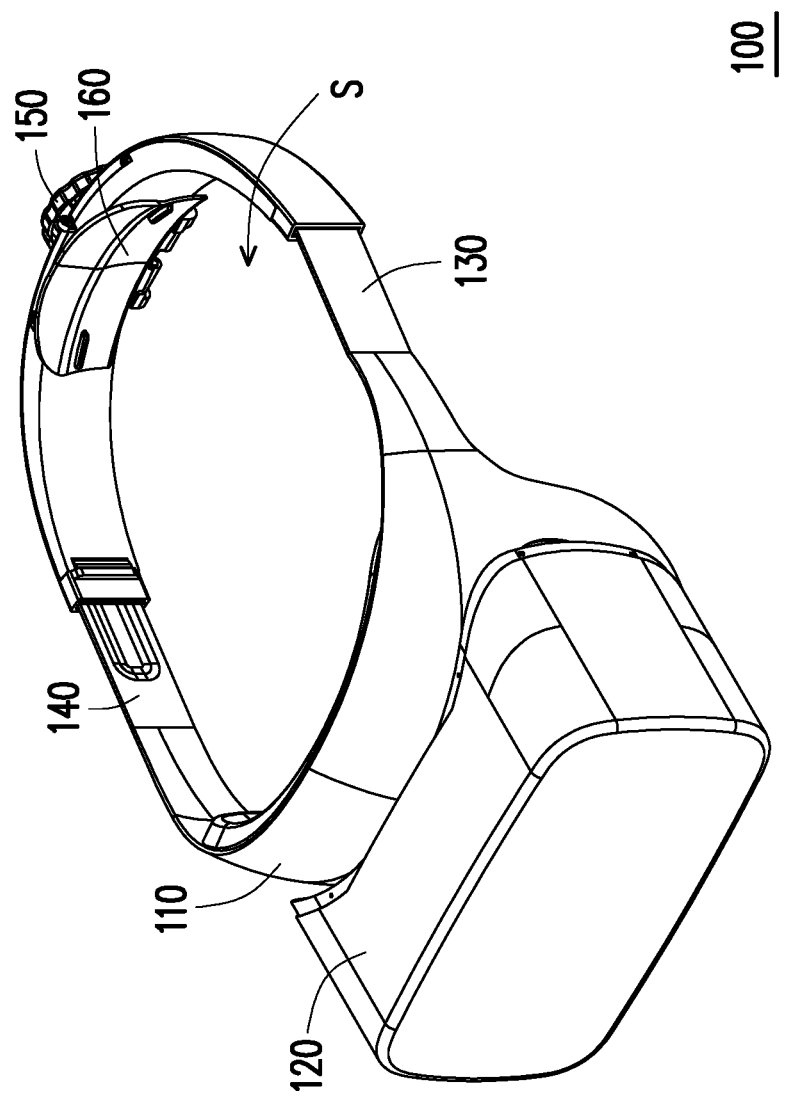
FIG. 1A is a perspective view of a head-mounted display in accordance with an embodiment of the invention.
Figure 1B:
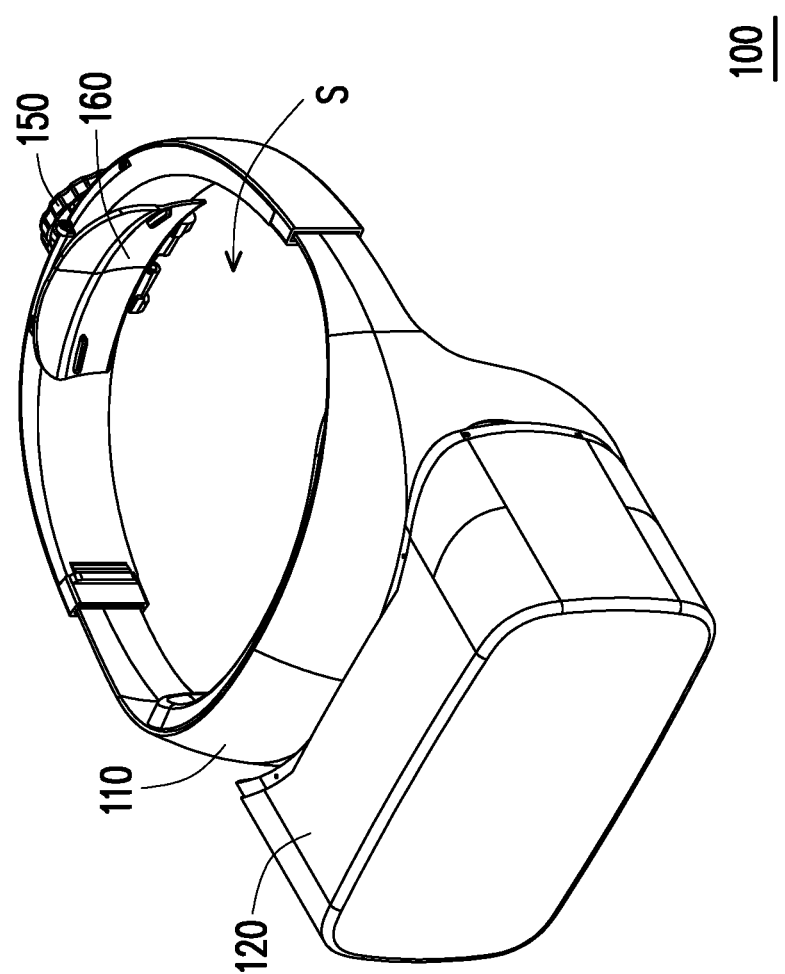
FIG. 1B is a perspective view of reduced wearing space of the head-mounted display of FIG. 1A.
Figure 1C:
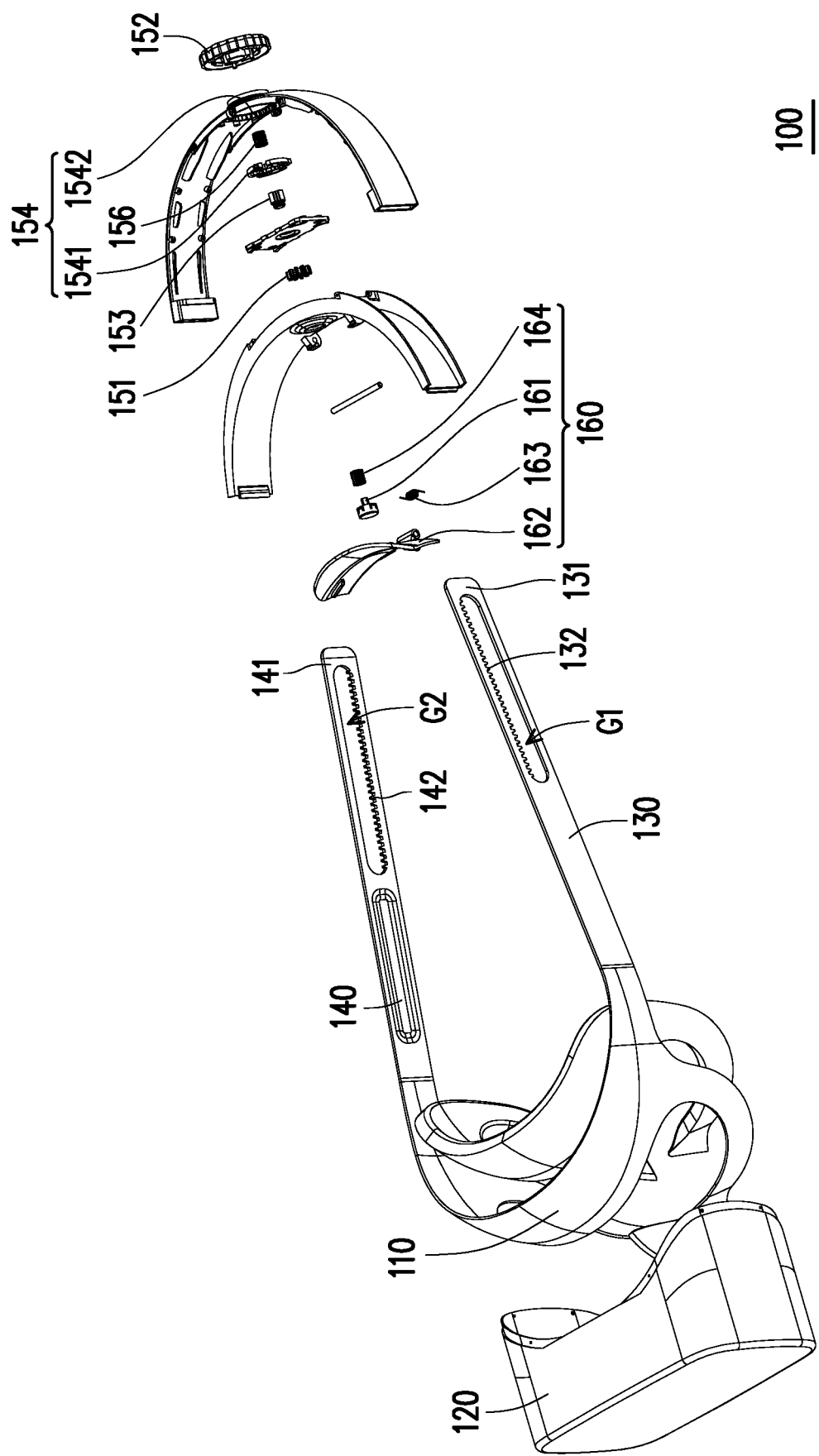
FIG. 1C is an exploded view of the components of the head-mounted display of FIG. 1A.
Figure 1D:
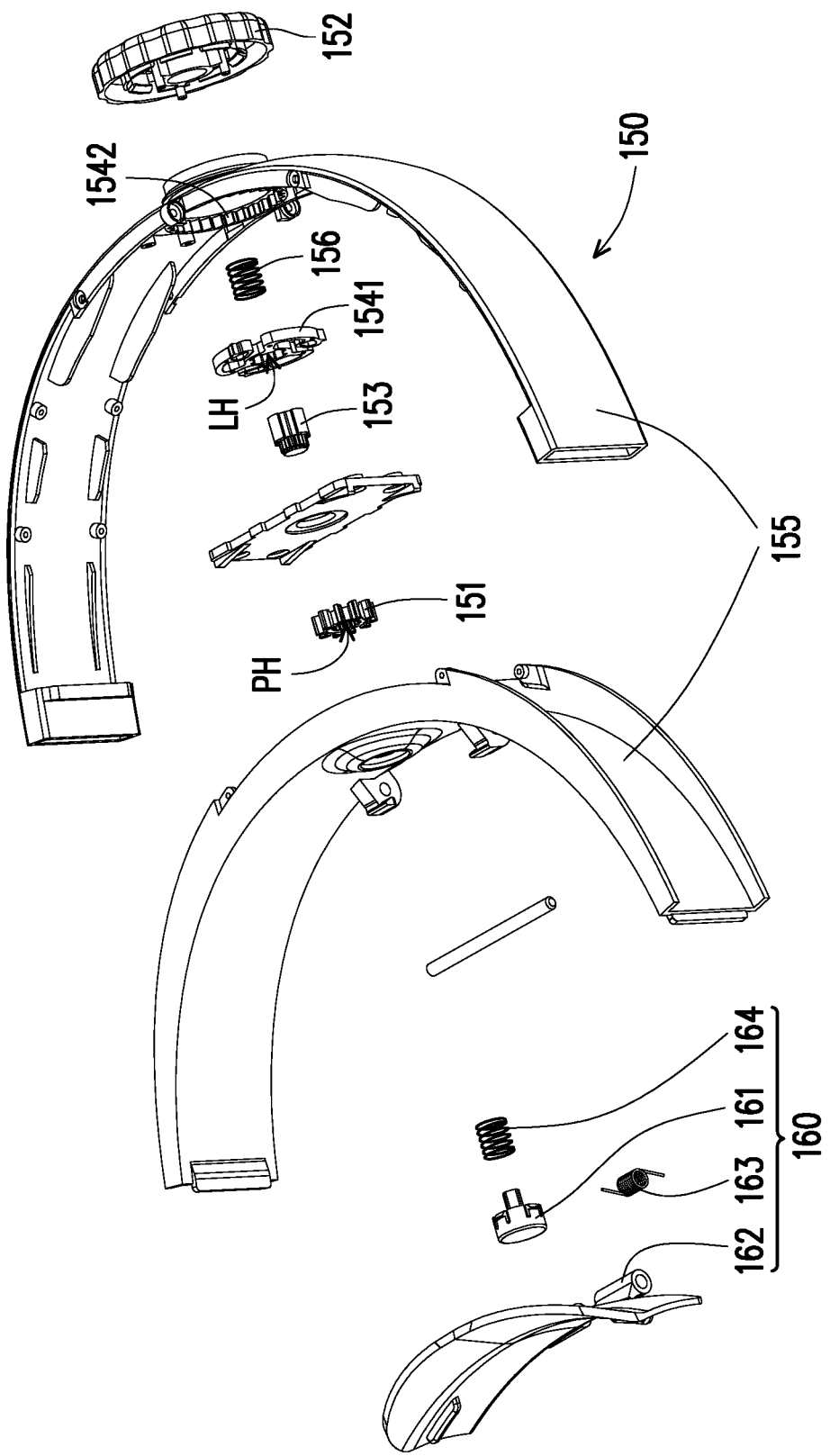
FIG. 1D is a partially-enlarged schematic of the head-mounted display of FIG. 1C.
Figure 1E:
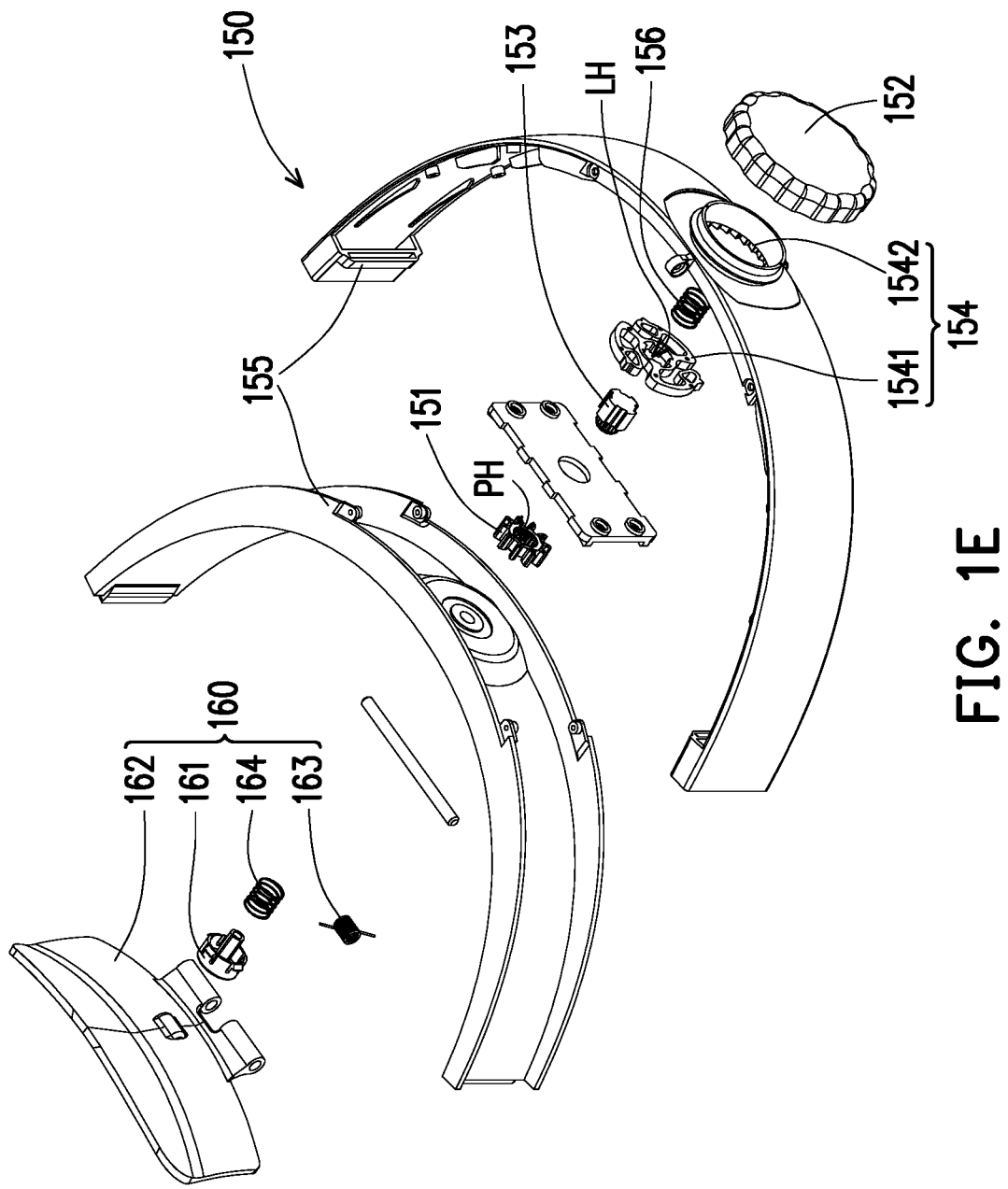
FIG. 1E is a partially-enlarged schematic of another angle of the head-mounted display of FIG. 1C.

FIG. 1A is a perspective view of a head-mounted display in accordance with an embodiment of the invention. FIG. 1B is a perspective view of reduced wearing space of the head-mounted display of FIG. 1A. FIG. 1C is an exploded view of the components of the head-mounted display of FIG. 1A. FIG. 1D is a partially-enlarged schematic of the head-mounted display of FIG. 1C. FIG. 1E is a partially-enlarged schematic of another angle of the head-mounted display of FIG. 1C.

Referring to FIG. 1A to FIG. 1C, a head-mounted display 100 of the present embodiment includes a wearing portion 110, a display body 120, a first strap 130, a second strap 140, an adjustment assembly 150, and a switching assembly 160.

The wearing portion 110 is made of, for example, plastic, cloth, or other similar materials. The inside of the wearing portion 110 is provided with a soft pad made of sponge or other materials adapted to be in contact with the head of a user. The display body 120 is connected to the wearing portion 110 and is configured to output an image to the eyes of the user. The first strap 130 and the second strap 140 are respectively connected to two opposite sides of the wearing portion 110. In the present embodiment, the first strap 130, the second strap 140, and the wearing portion 110 are, for example, an integrally-formed structure. In particular, the first strap 130, the second strap 140, and the wearing portion 110 define a wearing space S, and a first portion 131 of the first strap 130 and a second portion 141 of the second strap 140 are overlapped with each other.

Figure 2A:
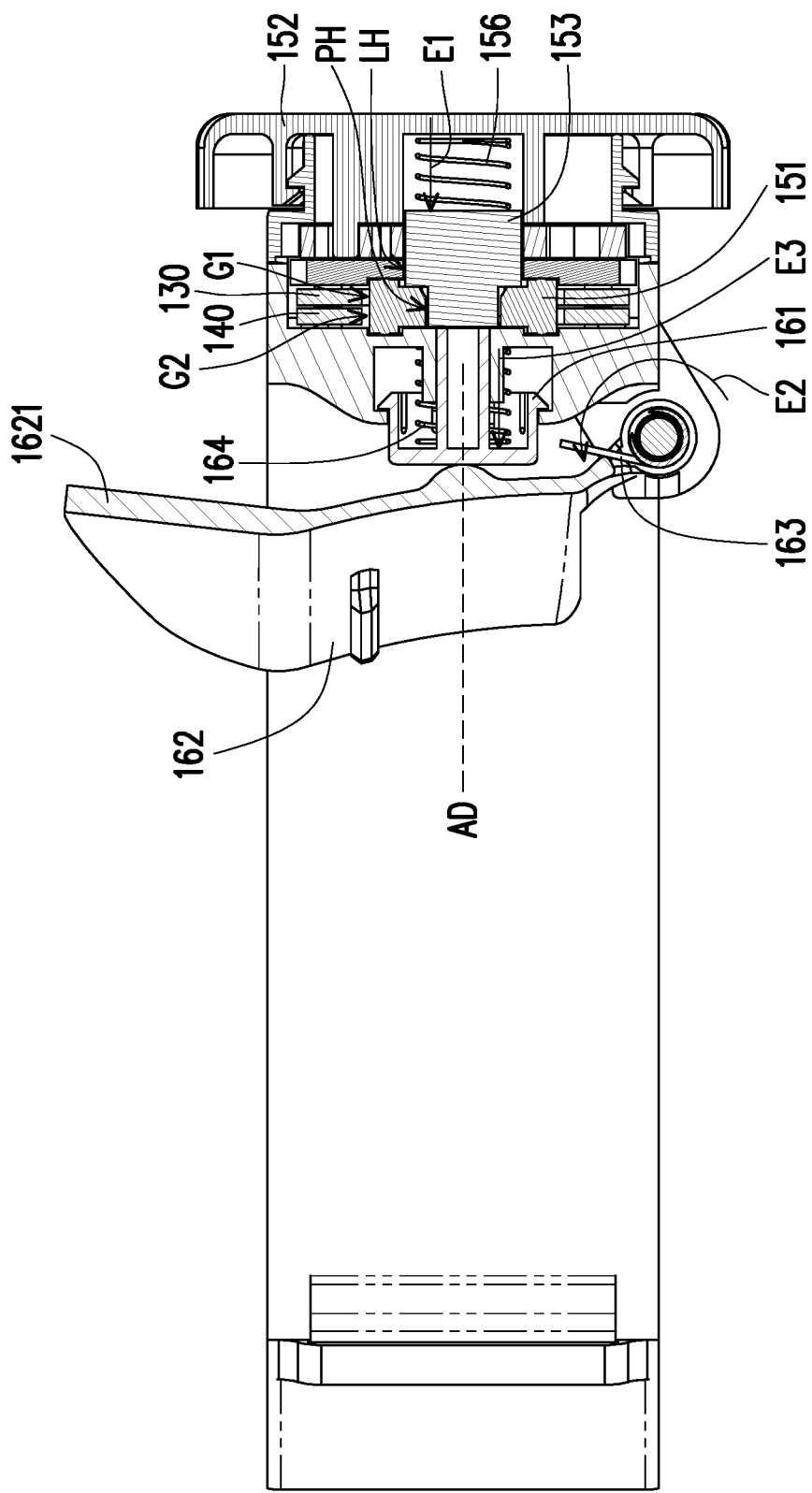
FIG. 2A is a cross section of the coupled state of the adjustment assembly and the first strap and the second strap of FIG. 1A.
Figure 2B:
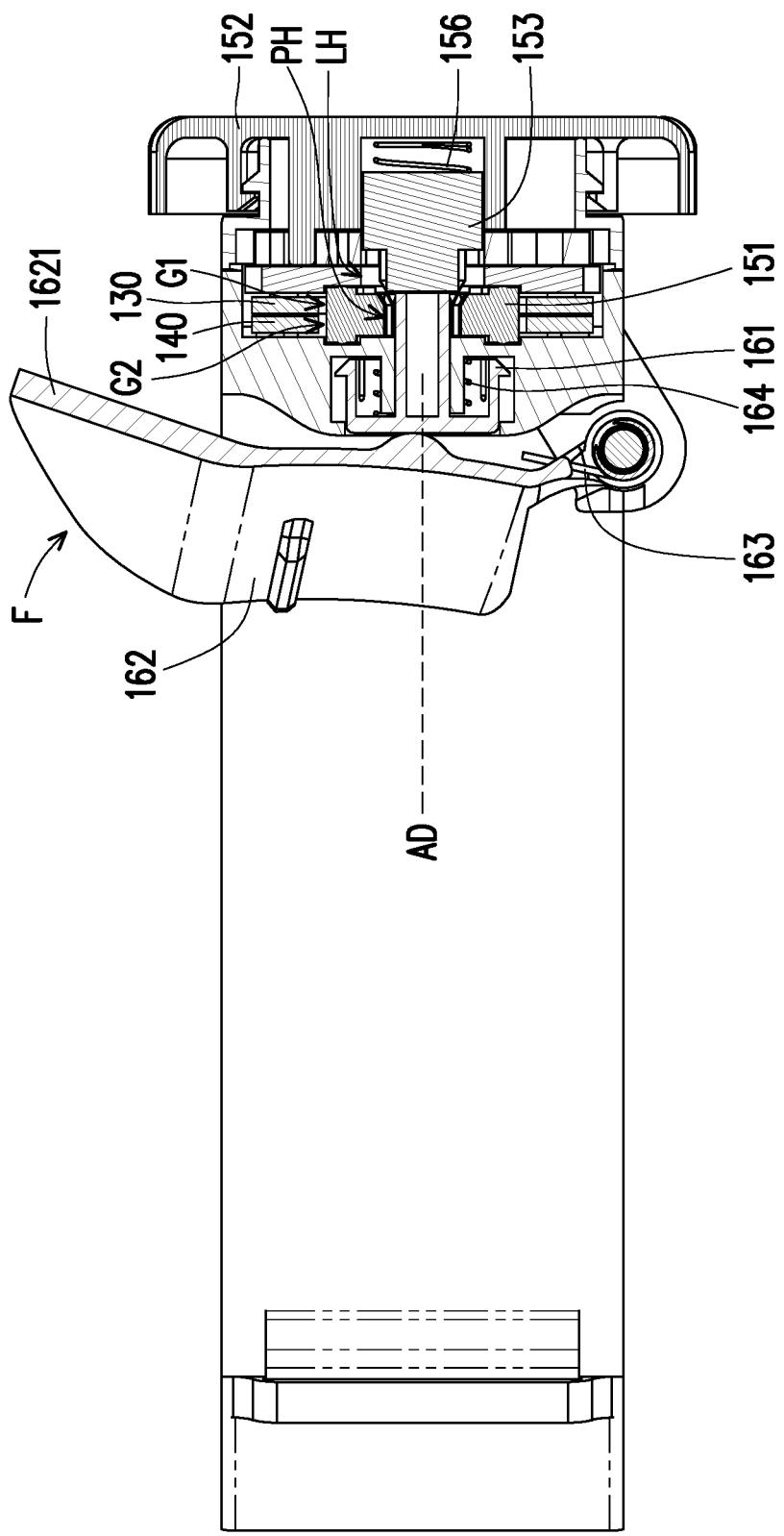
FIG. 2B is a cross section of the decoupled state of the adjustment assembly and the first strap and the second strap of FIG. 1A.
Figure 2C:
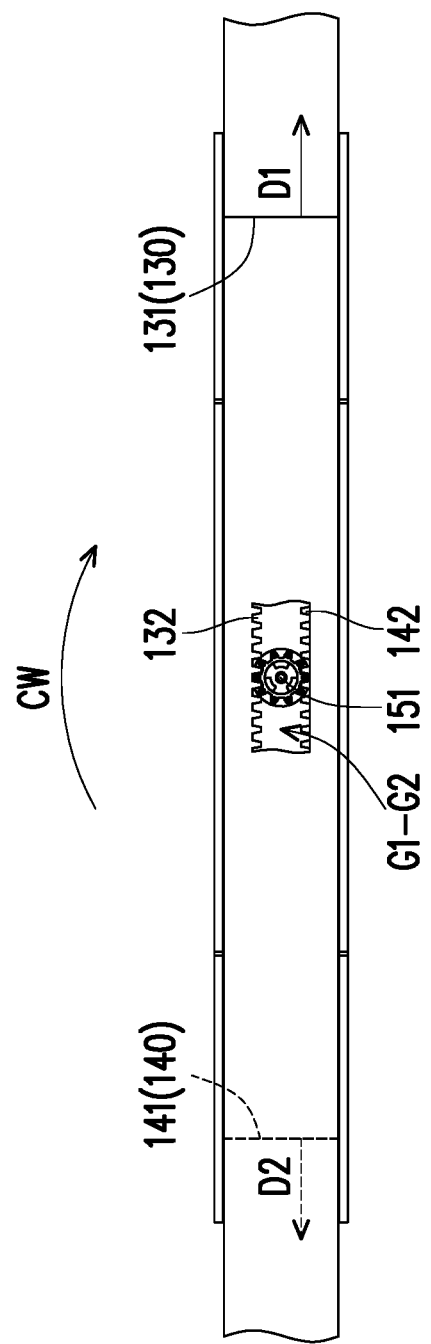
FIG. 2C is a schematic of increased degree of overlap of the first strap and the second strap of FIG. 1A.

FIG. 2A is a cross section of the coupled state of the adjustment assembly and the first strap and the second strap of FIG. 1A. FIG. 2B is a cross section of the decoupled state of the adjustment assembly and the first strap and the second strap of FIG. 1A. FIG. 2C is a schematic of the degree of overlap of the first strap and the second strap of FIG. 1A.

Referring to FIG. 2A, the adjustment assembly 150 is adapted to be coupled to the first strap 130 and the second strap 140 and is configured to adjust the degree of overlap of the first portion 131 and the second portion 141 to thereby change the size of the wearing space S. More specifically, referring to FIG. 2A and FIG. 2C, the reduction in the degree of overlap of the first portion 131 and the second portion 141 represents an increase in the wearing space S. On the contrary, referring to FIG. 2B, the increase in the degree of overlap of the first portion 131 and the second portion 141 represents a reduction in the wearing space S.

Referring to FIG. 2A and FIG. 2B, the switching assembly 160 is disposed at the adjustment assembly 150 to switch the adjustment assembly 150 to a coupled state or a decoupled state. In particular, the adjustment assembly 150 is coupled to the first strap 130 and the second strap 140 in the coupled state to drive the first strap 130 and the second strap 140 to move relative to each other to increase or decrease the degree of overlap between each other. In addition, the adjustment assembly 150 is decoupled from the first strap 130 and the second strap 140 in the decoupled state, therefore, the adjustment assembly 150 no longer restricts the first strap 130 and the second strap 140, such that the first strap 130 and the second strap 140 may move freely relative to the adjustment assembly 150 under the effect of an external force, thus achieving a rapid adjustment effect.

Referring also to FIG. 1C and FIG. 2C, in the present embodiment, the first portion 131 of the first strap 130 has a first slot G1, and a first rack 132 is formed at a single side of the first slot G1. The second portion 141 of the first strap 140 has a second slot G2 overlapped with the first slot G1, and a second rack 142 parallel to the first rack 132 is formed at a side of the second slot G2 opposite to the single side. In short, the first rack 132 and the second rack 142 are disposed in parallel in the up and down direction.

Referring also to FIG. 1D and FIG. 1E, the adjustment assembly 150 includes a driven gear 151, a knob 152, and a transmission member 153. The driven gear 151 is disposed in the first slot G1 and the second slot G2 and is engaged with the first rack 132 and the second rack 142, wherein the driven gear 151 is configured to drive the first strap 130 and the second strap 140 to move relatively to each other to change the degree of overlap of the first slot G1 and the second slot G2. The knob 152 is adapted to receive an external force to produce a rotation. The transmission member 153 is coupled to the driven gear 151 and the knob 152, such that the driven gear 151 is rotated by turning the knob 152.

More specifically, with reference to FIG. 1B, FIG. 2B, and FIG. 2C, when the knob 152 is rotated in a clockwise direction CW, the driven gear 151 is driven by the transmission member 153 to rotate in the clockwise direction CW, and the first rack 132 and the second rack 142 are linked via the driven gear 151, such that the first strap 130 and the second strap 140 are respectively moved toward a first direction D1 and a second direction D2 to increase the degree of overlap of the first slot G1 and the second slot G2 to thereby reduce the size of the wearing space S (see FIG. 1B).

Figure 2D:
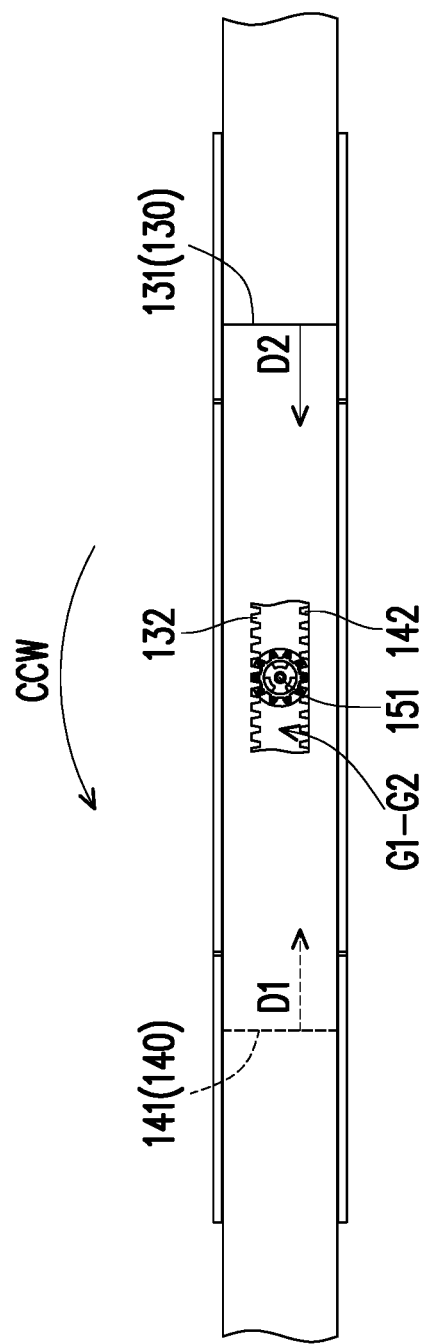
FIG. 2D is a schematic of reduced degree of overlap of the first strap and the second strap of FIG. 1A.

Referring to FIG. 1A, FIG. 2A, and FIG. 2D, when the knob 152 is rotated in a counterclockwise direction CCW, the driven gear 151 is driven by the transmission member 153 to rotate in the counterclockwise direction CCW, and the first rack 151 and the second rack 142 are linked via the driven gear 151 such that the first strap 130 and the second strap 140 are respectively moved toward the second direction D2 and the first direction D1 to reduce the degree of overlap of the first slot G1 and the second slot G2 to further increase the size of the wearing space S (see FIG. 1A).

Referring to FIG. 1C to FIG. 1E, the adjustment assembly 150 further includes a one-way motion mechanism 154 coupled to the knob 152 for restricting the knob 152 to rotate in a single direction, wherein the one-way motion mechanism 154 includes a ratchet 1541 and a pawl 1542 coupled to each other and respectively disposed at the knob 152 and a case 155. The pawl 1542 is configured to restrict the ratchet 1541 to prevent the knob 152 from rotating in the opposite direction. In the present embodiment, the single direction is, for example, the clockwise direction CW, such the adjustment assembly 150 is adapted to reduce the size of the wearing space S. In other embodiments, the single direction, for example, refers to the counterclockwise direction CCW, such that the adjustment assembly is adapted to increase the size of the wearing space S.

Referring to FIG. 1D, FIG. 1E, and FIG. 2A, the driven gear 151 includes a positioning hole PH, and one end of the transmission member 153 is adapted to pass through the positioning hole PH to be engaged with the driven gear 151 on the circumference of the positioning hole PH. More specifically, the ratchet 1541 also includes a limiting hole LH, and another end of the transmission member 153 is adapted to pass through the limiting hole LH to be engaged with the ratchet 1541. Therefore, the ratchet 1541 is adapted to drive the driven gear 151 via the transmission member 153.

Referring to FIG. 2A and FIG. 2B, the switching assembly 160 is configured to be adapted to push the transmission member 153 of the adjustment assembly 150 to move along an axial direction AD of the positioning hole PH such that the transmission member 153 leaves the positioning hole PH and is disengaged from the driven gear 151. The adjustment assembly 150 further includes a first restoring spring 156 connected to the transmission member 153. The first restoring spring 156 is configured to keep the transmission member 153 engaged with the driven gear 151 in the original state thereof. In addition, the first restoring spring 156 is, for example, a compression spring, and pushes the transmission member 153 into the positioning hole PH in the original state (i.e., stretched state).

Referring also to FIG. 1D, FIG. 1E, FIG. 2A, and FIG. 2B, the switching assembly 160 includes a pushing member 161, a driving member 162, a second restoring spring 163, and a third restoring spring 164.

The pushing member 161 bears against the transmission member 153 to push the transmission member 153 to move along the axial direction AD. The pushing member 161 is configured to be adapted to move along the axial direction AD of the positioning hole PH. The driving member 162 bears against the pushing member 161. The first force-receiving portion 1621 of the driving member 162 is protruded out of the case 155, and the driving member 162 drives the pushing member 161 to move when the first force-receiving portion 1621 receives an external force F, and the pushing member 161 push the transmission member 153 to move along the axial direction AD. In detail, the driving member 162 of the present embodiment is pivotally connected to the case 155 and is pivotally rotated relative to the case 155 when receiving the external force F.

The second restoring spring 163 is, for example, a torsion spring connected to the driving member 162 and the case 155, and the second restoring spring 163 is configured such that the transmission member 153 is engaged with the driven gear 151 in the original state thereof. The third restoring spring 164 is, for example, a compression spring connected to the pushing member 161. The third restoring spring 164 is configured to engage the transmission member 153 with the driven gear 151 in the original state thereof. In short, the second restoring spring 163 makes the driving member 162 pivotally rotate and be relatively far from the case 155 in the original state, while the pushing member 161 is pushed by the third restoring spring 164 to move outward along the axial direction AD. Lastly, the transmission member 153 is pushed by the first restoring spring 156, and is reset along the axial direction AD and engaged with the positioning hole PH of the driven gear 151.

Referring to FIG. 2B, when the adjustment assembly 150 is switched to the decoupled state, the external force F is applied to the first force-receiving portion 1621 and the pushing member 161 is driven to move via the driving member 162, such that the pushing member 161 pushes the transmission member 153 to move along the axial direction AD, thus causing the transmission member 153 to be disengaged from the positioning hole PH of the driven gear 151. Therefore, the driven gear 151 is no longer restricted by the transmission member 153. Referring to FIG. 1A and FIG. 1B, at this point, the user is adapted to directly pull the case 155 such that the first strap 130 and the second strap 140 are free to move relative to the case 155 of the adjustment assembly 150, and the degree of overlap of the first strap 130 and the second strap 140 is adjusted via the rotation of the driven gear 151 to achieve the effect of rapid adjustment of the size of the wearing space S. When the adjustment assembly 150 is restored to the coupled state, by only releasing the external force F, the transmission member 153, the pushing member 161, and the driving member 162 are returned to the original positions by respectively pushing via elastic forces E1, E2, and E3 released by the first restoring spring 156, the second restoring spring 163, and the third restoring spring 164 (as shown in FIG. 2A).

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 3A:
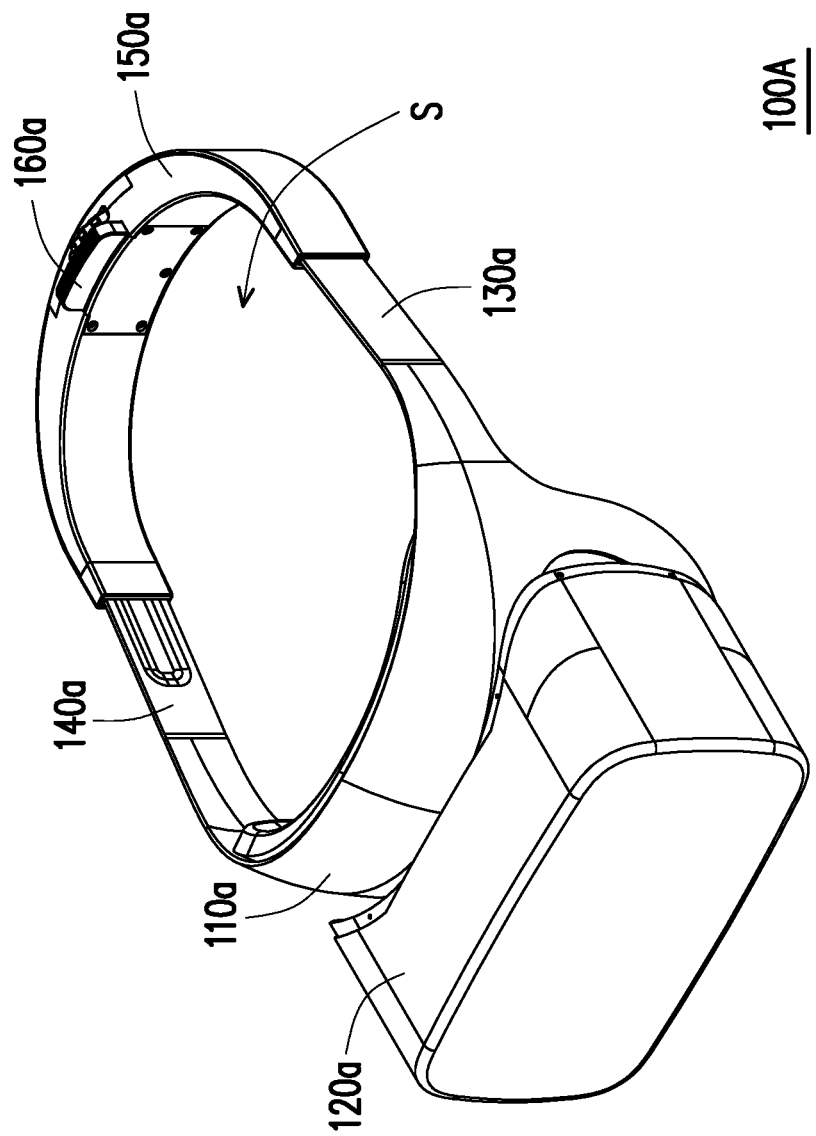
FIG. 3A is a perspective view of a head-mounted display in accordance with another embodiment of the invention.
Figure 3B:
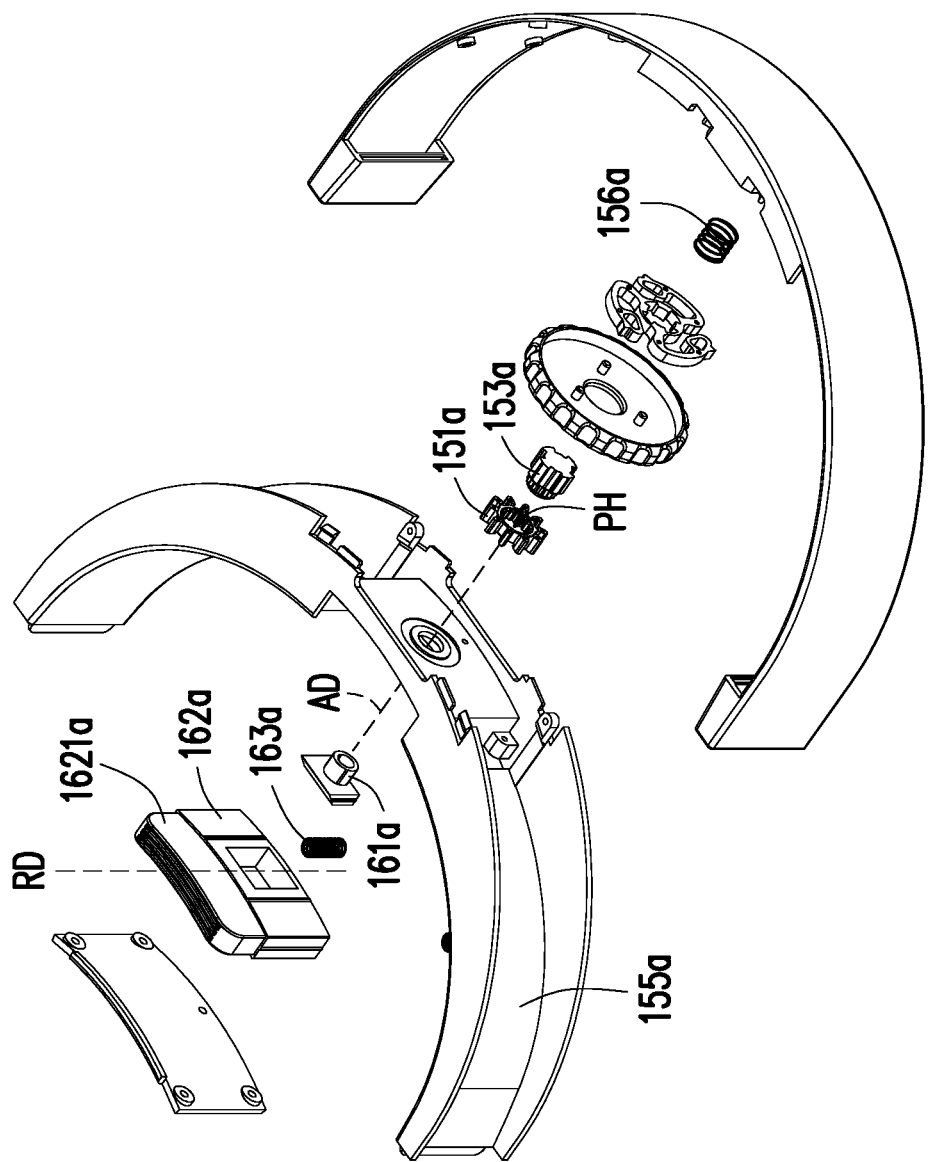
FIG. 3B is an exploded view of some of the components of the head-mounted display of FIG. 3A.
Figure 3C:
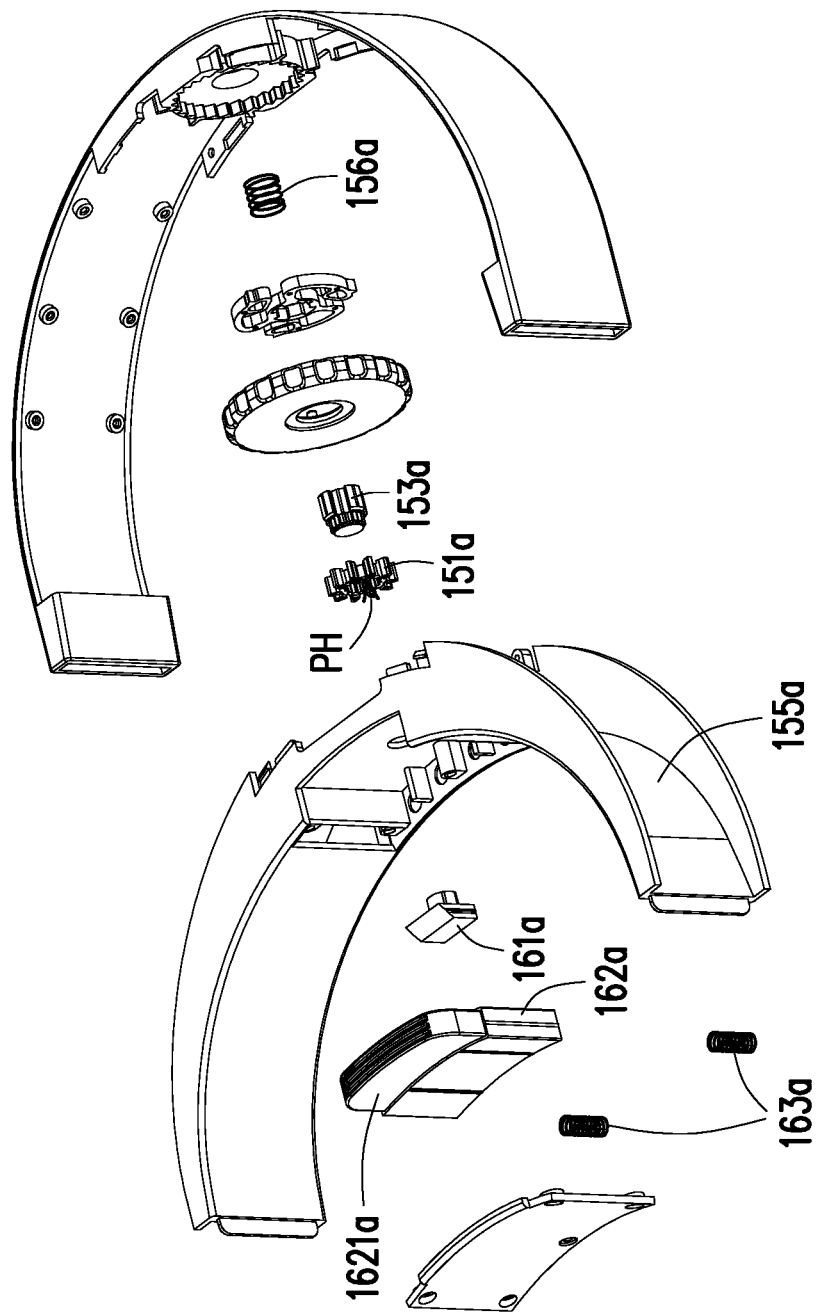
FIG. 3C is an exploded view of some of the components of the head-mounted display of FIG. 3A from another angle.
Figure 4A:
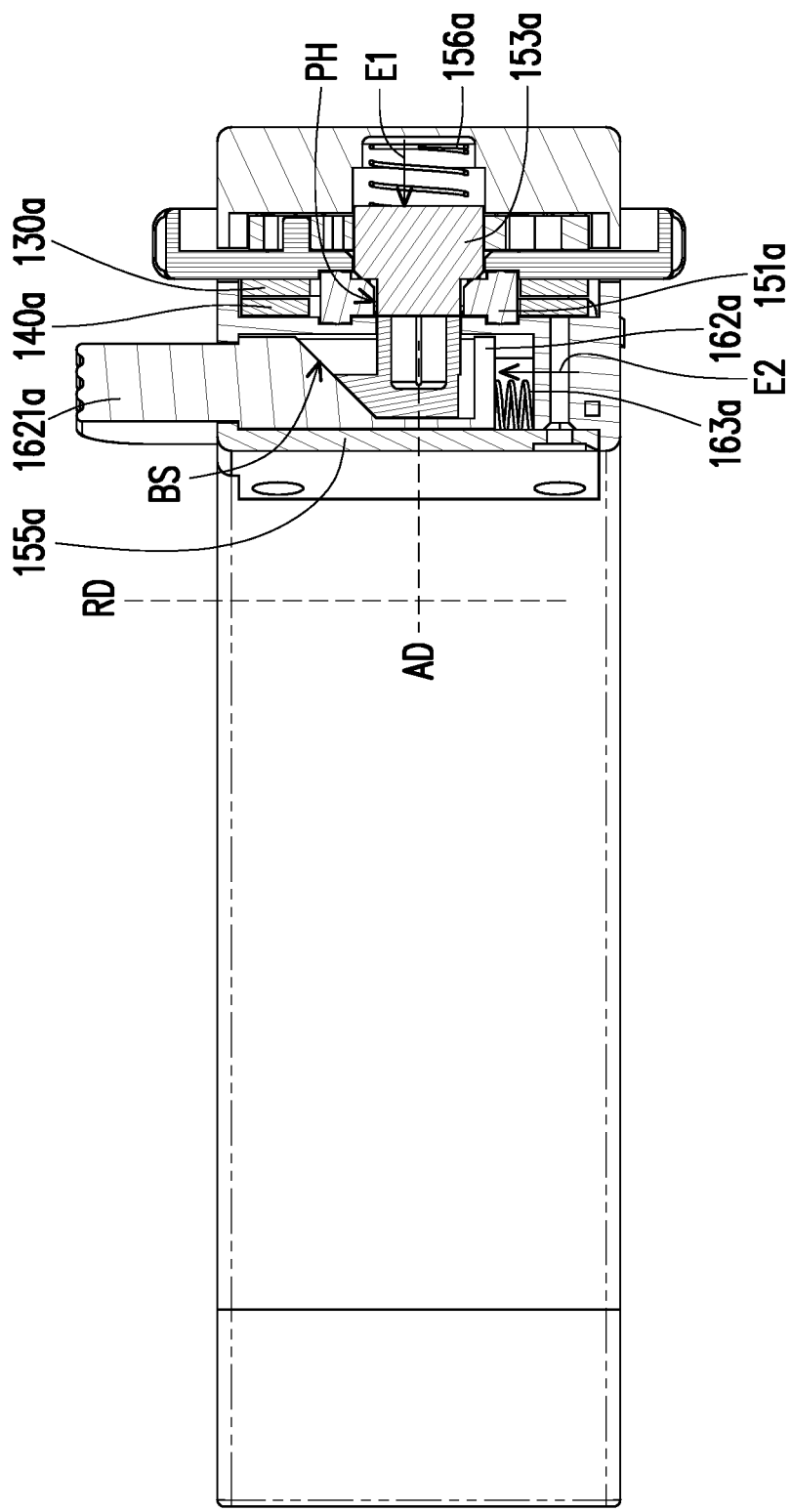
FIG. 4A is a cross section of the coupled state of the adjustment assembly and the first strap and the second strap of FIG. 3A.
Figure 4B:
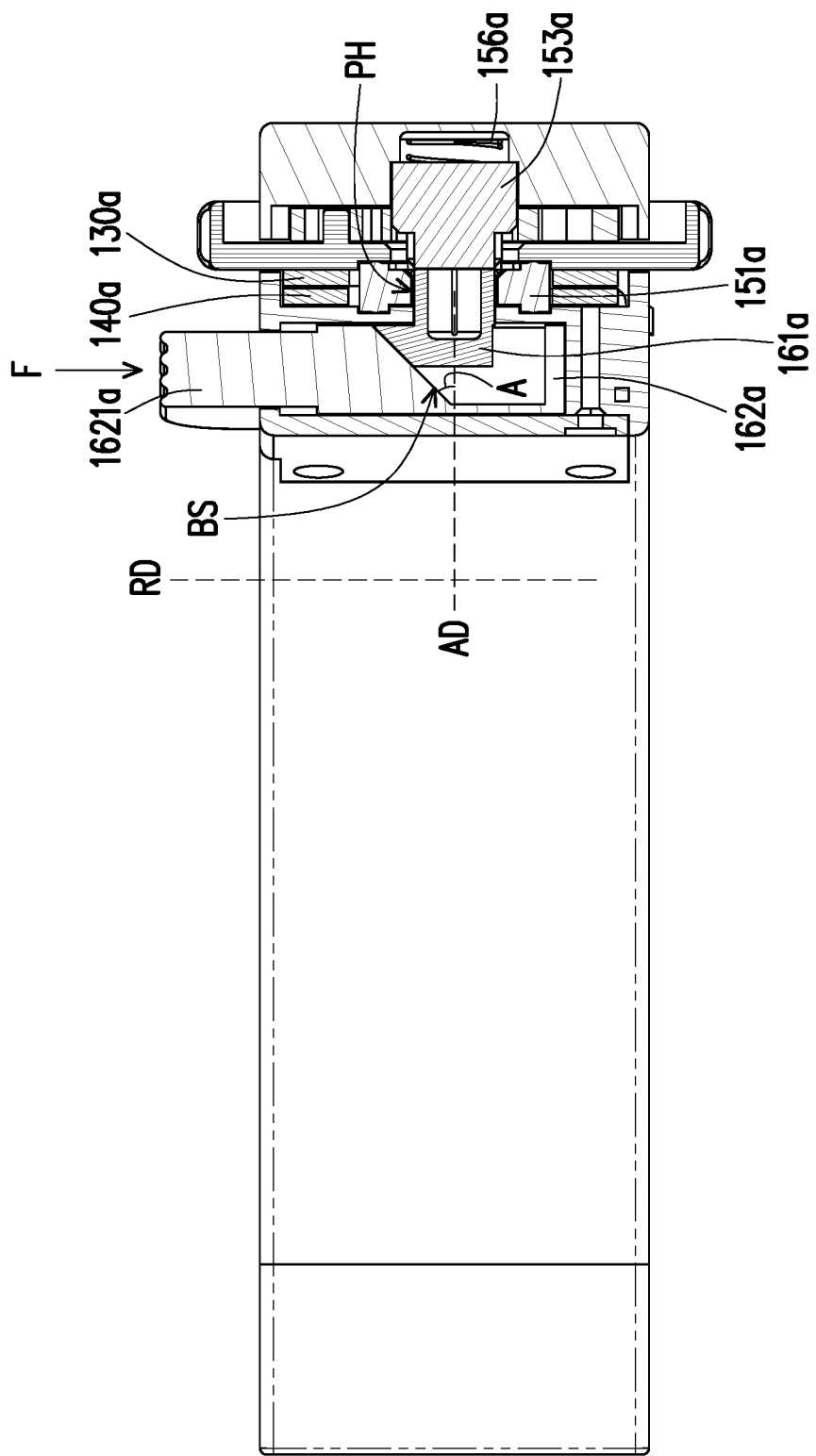
FIG. 4B is a cross section of the decoupled state of the adjustment assembly and the first strap and the second strap of FIG. 3A.

FIG. 3A is a perspective view of a head-mounted display in accordance with another embodiment of the invention. FIG. 3B is an exploded view of some of the components of the head-mounted display of FIG. 3A. FIG. 3C is an exploded view of some of the components of the head-mounted display of FIG. 3A from another angle. FIG. 4A is a cross section of the coupled state of the adjustment assembly and the first strap and the second strap of FIG. 3A. FIG. 4B is a cross section of the decoupled state of the adjustment assembly and the first strap and the second strap of FIG. 3A.

Referring to FIG. 3A to FIG. 3C and FIG. 4A and FIG. 4B, a head-mounted display 100A of the present embodiment is similar to the head-mounted display 100 of FIG. 1A, and includes a wearing portion 110a, a display body 120a, a first strap 130a, a second strap 140a, and an adjustment assembly 150a, and the difference is that the switching assembly 160a of the head-mounted display 100A includes a pushing member 161a, a driving member 162a, and at least one second restoring spring 163a.

The pushing member 161a bears against the transmission member 153a to push the transmission member 153a to move along the axial direction AD. The pushing member 161 is configured to be adapted to move along the axial direction AD of the positioning hole PH. The driving member 162a is slidably disposed at the case 155a and perpendicular to the axial direction AD, and the driving member 162a generates a movement along a radial direction RD relative to the case 155a when receiving the external force F. The driving member 162a has a sloped surface BS and the sloped surface BS bears against the pushing member 161a, wherein there is an angle A not equal to 90 degrees between the sloped surface BS and the axial direction AD.

The at least one second restoring spring 163a includes a plurality and is, for example, a compression spring connected to the driving member 162a and the case 155a, and the plurality of second restoring springs 163a are configured to engage the transmission member 153a with the driven gear 151a in the original state thereof. More specifically, two ends of each of the second restoring springs 163a respectively push against the driving member 162a and the case 155a along the radial direction RD, and in the original state (i.e., stretched state), a first force-receiving portion 1621a of the driving member 162a is protruded upward out of the case 155a.

Referring to FIG. 4A and FIG. 4B, when the adjustment assembly 150a is switched to the decoupled state, the external force F is applied to the first force-receiving portion 1621a and the pushing member 161a is driven to move via the sloped surface BS of the driving member 162a, such that the pushing member 161a pushes the transmission member 153a to move along the axial direction AD, thus causing the transmission member 153a to be disengaged from the positioning hole PH of the driven gear 151a. Therefore, the driven gear 151a is no longer restricted by the transmission member 153a. When the adjustment assembly 150a is restored to the coupled state, by only releasing the external force F, the transmission member 153a, the pushing member 161a, and the driving member 162a are returned to the original positions by respectively pushing via the elastic forces E1 and E2 released by the first restoring spring 156a and the second restoring spring 163a.

Figure 5A:
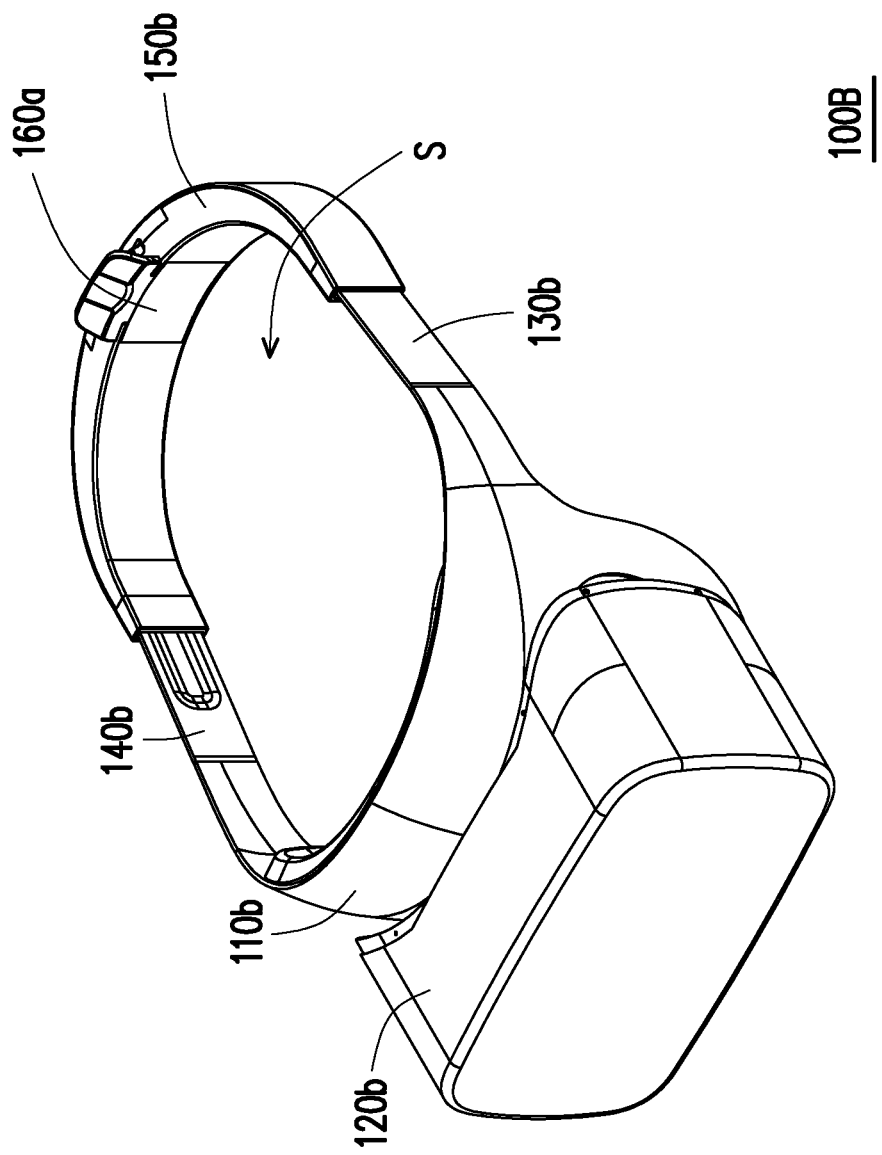
FIG. 5A is a perspective view of a head-mounted display in accordance with yet another embodiment of the invention.
Figure 5B:
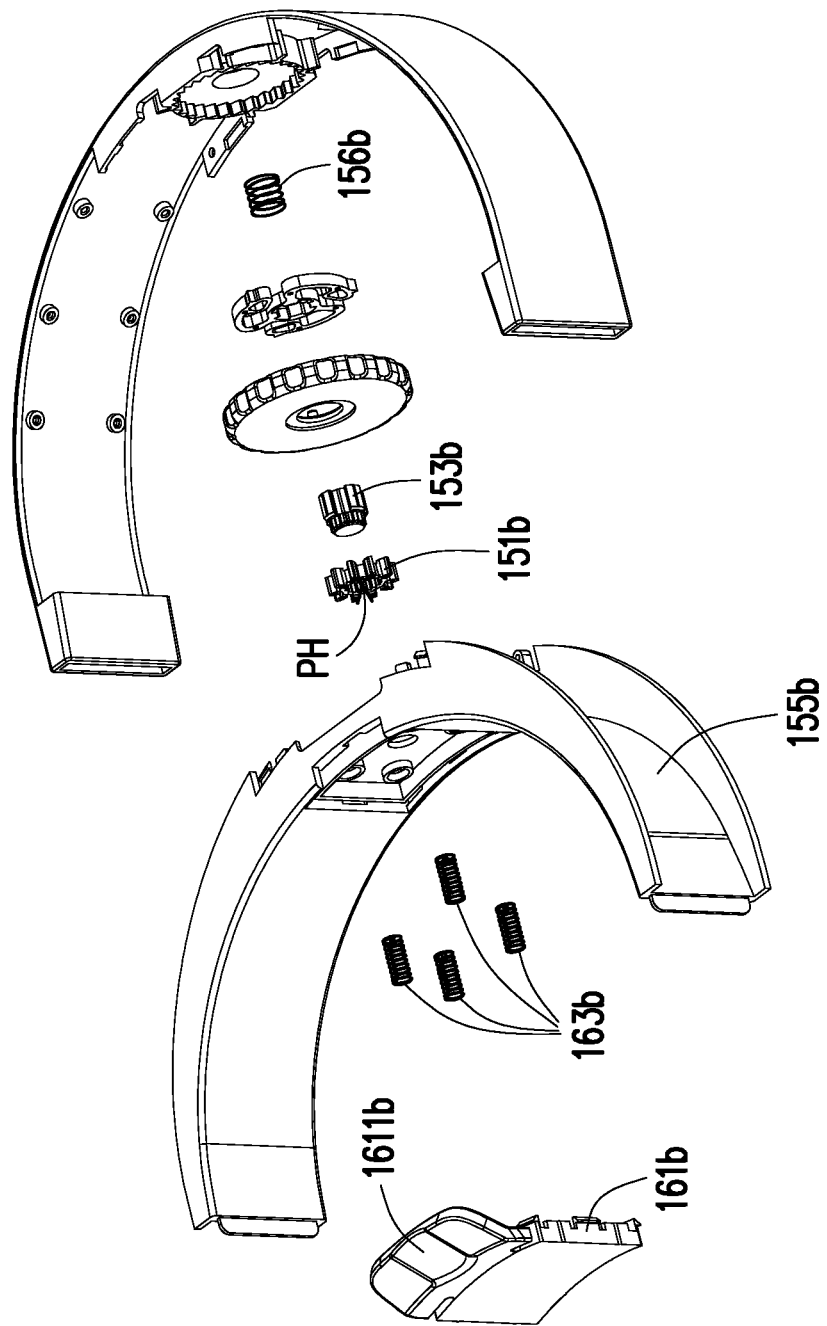
FIG. 5B is an exploded view of some of the components of the head-mounted display of FIG. 5A.
Figure 5C:
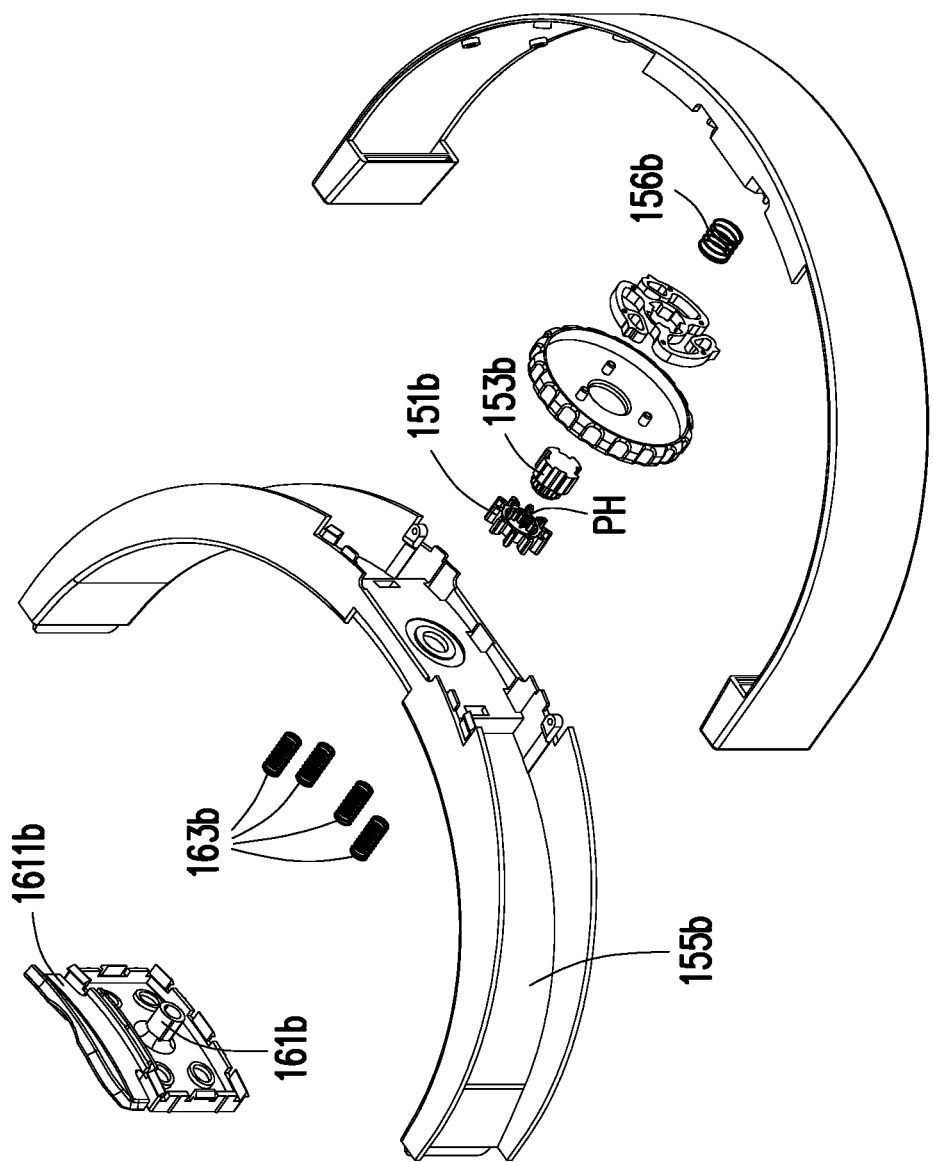
FIG. 5C is an exploded view of some of the components of the head-mounted display of FIG. 5A from another angle.
Figure 6A:
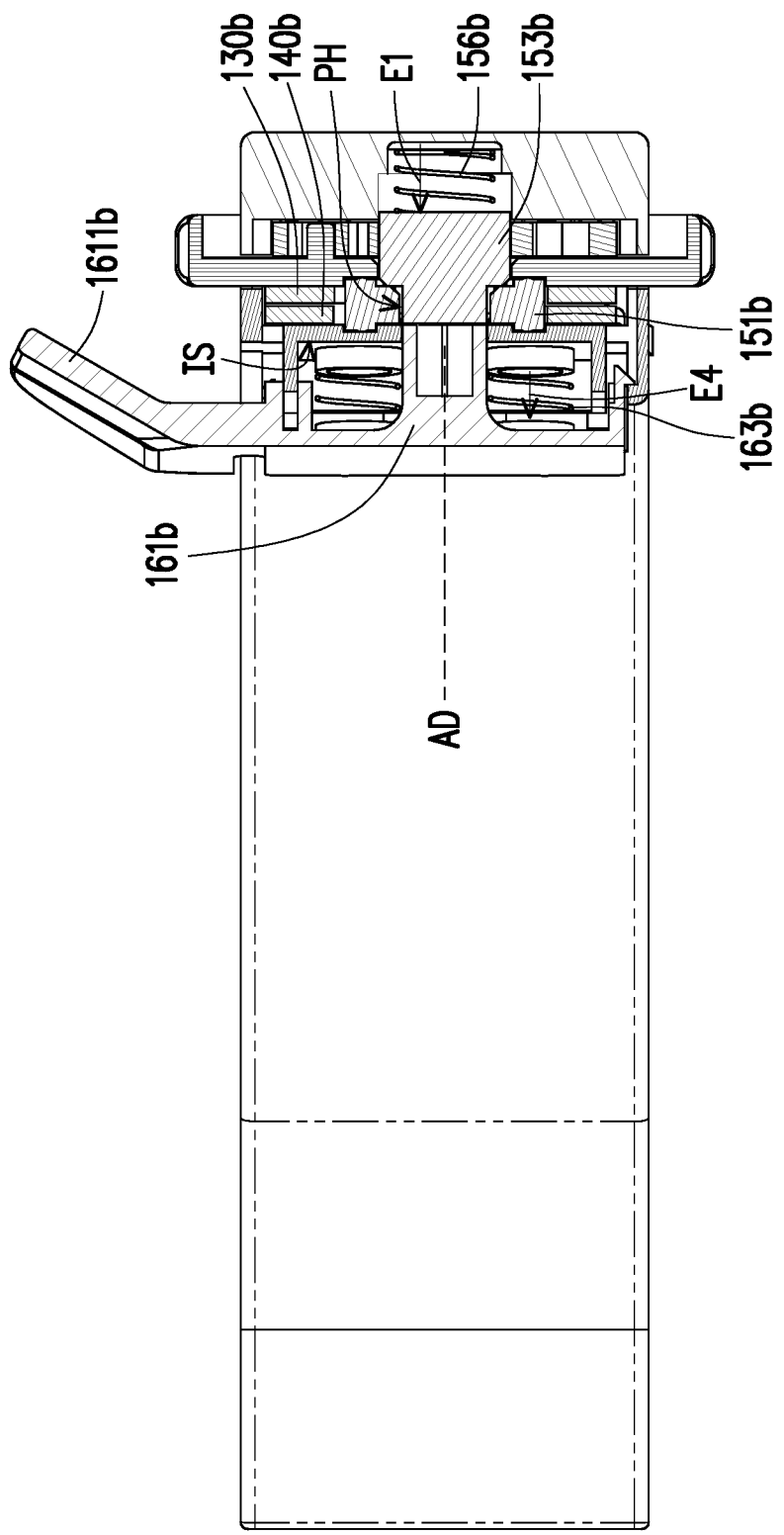
FIG. 6A is a cross section of the coupled state of the adjustment assembly and the first strap and the second strap of FIG. 5A.
Figure 6B:
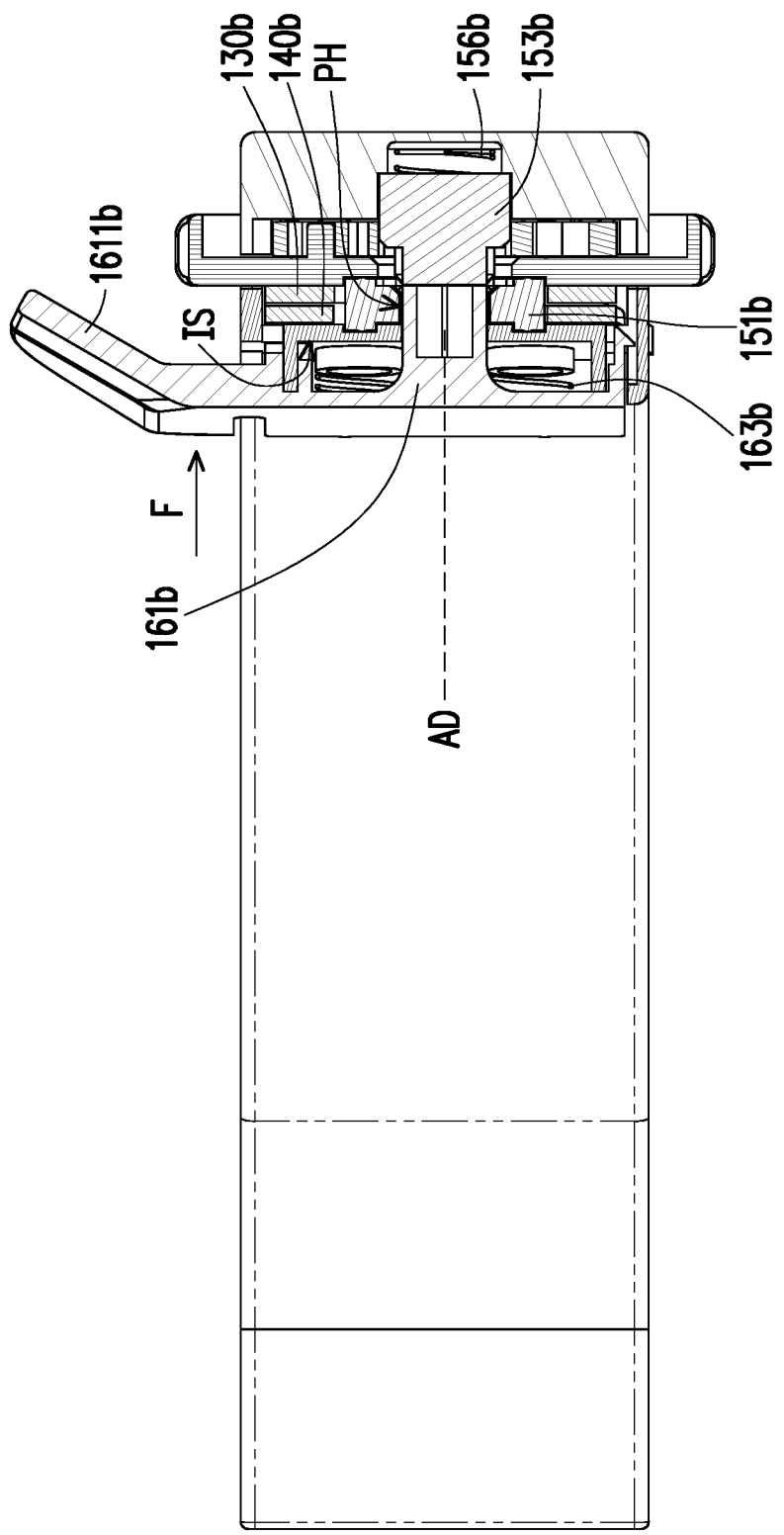
FIG. 6B is a cross section of the decoupled state of the adjustment assembly and the first strap and the second strap of FIG. 5A.

FIG. 5A is a perspective view of a head-mounted display in accordance with yet another embodiment of the invention. FIG. 5B is an exploded view of some of the components of the head-mounted display of FIG. 5A. FIG. 5C is an exploded view of some of the components of the head-mounted display of FIG. 5A from another angle. FIG. 6A is a cross section of the coupled state of the adjustment assembly and the first strap and the second strap of FIG. 5A. FIG. 6B is a cross section of the decoupled state of the adjustment assembly and the first strap and the second strap of FIG. 5A.

Referring to FIG. 5A to FIG. 5C and FIG. 6A and FIG. 6B, a head-mounted display 100B of the present embodiment is similar to the head-mounted display 100 of FIG. 1A, and includes a wearing portion 110b, a display body 120b, a first strap 130b, a second strap 140b, and an adjustment assembly 150b. The difference is that the switching assembly 160b of the head-mounted display 100B includes a pushing member 161b and at least one fourth restoring spring 163b.

The pushing member 161b bears against the transmission member 153b to push the transmission member 153b to move along the axial direction AD. The pushing member 161b is configured to be adapted to move along the axial direction AD of the positioning hole PH. A second force-receiving portion 1611b of the pushing member 161b is protruded out of the case 155b, and the pushing member 161b pushes the transmission member 153b to move along the axial direction AD when the second force-receiving portion 1611b receives the external force F.

The at least one fourth restoring spring 163b includes a plurality and is, for example, a compression spring, and the plurality of fourth restoring springs 163b are connected to the pushing member 161b along the axial direction AD. Each of the fourth restoring springs 163b is configured to engage the transmission member 153b with the driven gear 151b in the original state thereof. Further, two ends of each of the fourth restoring springs 163a respectively push against the pushing member 161b and an inner side surface IS of the case 155b along the axial direction AD, and in the original state (i.e., stretched state), the pushing member 161b is relatively far away from the inner side surface IS of the case 155b.

Referring to FIG. 6A and FIG. 6B, when the adjustment assembly 150a is switched to the decoupled state, the external force F is applied to the second force-receiving portion 1611b and the pushing member 161 is driven to move via the driving member 161b, such that the pushing member 161b pushes the transmission member 153b to move along the axial direction AD, thus disengaging the transmission member 153b from the positioning hole PH of the driven gear 151b. Therefore, the driven gear 151b is no longer restricted by the transmission member 153b. When the adjustment assembly 150b is restored to the coupled state, by only releasing the external force F, the pushing member 161b and the transmission member 153b are returned to the original positions by respectively pushing via an elastic force E4 and the elastic force E1 released by the plurality of fourth restoring springs 163b and the first restoring spring 156b.

Based on the above, in the head-mounted display of the invention, by adjusting the degree of overlap of the first strap and the second strap via the adjustment assembly, the wearing space is changed to fit the head shape and size of the user, and at this point the adjustment assembly is in the coupled state. In addition, the switching assembly may switch the adjustment assembly from the coupled state to the decoupled state. In the decoupled state, the adjustment assembly is decoupled from the first strap and the second strap, such that the first strap and the second strap are free to move relative to the adjustment assembly, such that the user may quickly adjust the size of the wearing space to achieve improved adjustment efficiency.

More specifically, when the adjustment assembly is switched from the decoupled state to the coupled state, by only releasing the external force applied, the adjustment assembly may be automatically returned to the original position via the pushing of the elastic force of each of the restoring spring to improve the adjustment efficiency.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A head-mounted display, comprising:
    a wearing portion;
    a first strap and a second strap respectively connected to two opposite sides of the wearing portion, wherein the first strap, the second strap, and the wearing portion define a wearing space, and a first portion of the first strap and a second portion of the second strap are overlapped with each other;
    an adjustment assembly adapted to couple the first strap and the second strap and configured to adjust a degree of overlap of the first portion and the second portion to thereby change the wearing space; and
    a switching assembly disposed at the adjustment assembly to switch the adjustment assembly to a coupled state or a decoupled state, wherein the adjustment assembly is coupled to the first strap and the second strap in the coupled state to drive the first strap and the second strap to move relative to each other, and the adjustment assembly is decoupled from the first strap and the second strap in the decoupled state such that the first strap and the second strap are free to move relative to the adjustment assembly;
    wherein, the adjustment assembly comprises a driven gear having a positioning hole and a transmission member, the switching assembly is configured to be adapted to push the transmission member to move along an axial direction of the positioning hole such that the transmission member leaves the positioning hole to be disengaged from the driven gear.

2. The head-mounted display of claim 1, wherein the first portion has a first slot, a first rack is formed at a single side of the first slot, the second portion has a second slot overlapped with the first slot, and a second rack parallel to the first rack is formed at a side of the second slot opposite to the single side, the adjustment assembly comprising:
    the driven gear disposed in the first slot and the second slot and engaged with the first rack and the second rack to drive the first strap and the second strap to move relative to each other;
    a knob; and
    the transmission member adapted to couple the driven gear and the knob to rotate the driven gear by rotating the knob.

3. The head-mounted display of claim 2, wherein the adjustment assembly further comprises a one-way motion mechanism coupled to the knob and configured to restrict the knob to rotate in a single direction.

4. The head-mounted display of claim 3, wherein the one-way motion mechanism comprises a ratchet and a pawl coupled to each other and respectively disposed at the knob and a case.

5. The head-mounted display of claim 2, wherein the transmission member is adapted to pass through the positioning hole to be engaged with the driven gear on a circumference of the positioning hole.

6. The head-mounted display of claim 1, wherein the adjustment assembly further comprises a first restoring spring connected to the transmission member, and the first restoring spring is configured to keep the transmission member engaged with the driven gear in an original state thereof.

7. The head-mounted display of claim 1, wherein the switching assembly comprises a pushing member bearing against the transmission member to push the transmission member to move along the axial direction.

8. The head-mounted display of claim 7, wherein the pushing member is configured to be adapted to move along the axial direction of the positioning hole, the switching assembly further comprises a driving member bearing against the pushing member, a first force-receiving portion of the driving member is protruded out of a case, and the driving member drives the pushing member to move when the first force-receiving portion receives an external force.

9. The head-mounted display of claim 8, wherein the driving member is pivotally connected to the case and pivotally rotated relative to the case when receiving the external force.

10. The head-mounted display of claim 9, wherein the switching assembly further comprises a second restoring spring connected to the driving member and the case, and the second restoring spring is configured to engage the transmission member with the driven gear in an original state thereof.

11. The head-mounted display of claim 8, wherein the driving member is slidably disposed at the case and moves relative to the case when receiving the external force, and the driving member has a sloped surface bearing against the pushing member.

12. The head-mounted display of claim 11, wherein the switching assembly further comprises at least one second restoring spring connected to the driving member and the case, and the at least one second restoring spring is configured to engage the transmission member with the driven gear in an original state thereof.

13. The head-mounted display of claim 7, wherein the switching assembly further comprises a third restoring spring connected to the pushing member, and the third restoring spring is configured to engage the transmission member with the driven gear in an original state thereof.

14. The head-mounted display of claim 7, wherein a second force-receiving portion of the pushing member is protruded out of a case, and the pushing member pushes the transmission member to move along the axial direction when the second force-receiving portion receives an external force.

15. The head-mounted display of claim 14, wherein the switching assembly further comprises at least one fourth restoring spring connected to the pushing member, and the at least one fourth restoring spring is configured to engage the transmission member with the driven gear in an original state thereof.

16. A strap structure, comprising:
a first strap and a second strap, wherein a first portion of the first strap and a second portion of the second strap are overlapped with each other;
an adjustment assembly adapted to couple the first strap and the second strap and configured to adjust a degree of overlap of the first portion and the second portion; and
a switching assembly disposed at the adjustment assembly to switch the adjustment assembly to a coupled state or a decoupled state, wherein the adjustment assembly is coupled to the first strap and the second strap in the coupled state to drive the first strap and the second strap to move relative to each other, and the adjustment assembly is decoupled from the first strap and the second strap in the decoupled state such that the first strap and the second strap are free to move relative to the adjustment assembly;
wherein, the adjustment assembly comprises a driven gear having a positioning hole and a transmission member, the switching assembly is configured to be adapted to push the transmission member to move along an axial direction of the positioning hole such that the transmission member leaves the positioning hole to be disengaged from the driven gear.

17. The strap structure of claim 16, wherein the first portion has a first slot, a first rack is formed at a single side of the first slot, the second portion has a second slot overlapped with the first slot, and a second rack parallel to the first rack is formed at a side of the second slot opposite to the single side, the adjustment assembly comprising:
the driven gear disposed in the first slot and the second slot and engaged with the first rack and the second rack to drive the first strap and the second strap to move relative to each other;
a knob; and
the transmission member adapted to couple the driven gear and the knob to rotate the driven gear by rotating the knob.

18. The strap structure of claim 17, wherein the adjustment assembly further comprises a one-way motion mechanism coupled to the knob and configured to restrict the knob to rotate in a single direction.

19. The strap structure of claim 18, wherein the one-way motion mechanism comprises a ratchet and a pawl coupled to each other and respectively disposed at the knob and a case.

20. The strap structure of claim 17, wherein the transmission member is adapted to pass through the positioning hole to be engaged with the driven gear on a circumference of the positioning hole.

21. The strap structure of claim 16, wherein the adjustment assembly further comprises a first restoring spring connected to the transmission member, and the first restoring spring is configured to keep the transmission member engaged with the driven gear in an original state thereof.

22. The strap structure of claim 16, wherein the switching assembly comprises a pushing member bearing against the transmission member to push the transmission member to move along the axial direction.

23. The strap structure of claim 22, wherein the pushing member is configured to be adapted to move along the axial direction of the positioning hole, the switching assembly further comprises a driving member bearing against the pushing member, a first force-receiving portion of the driving member is protruded out of a case, and the driving member drives the pushing member to move when the first force-receiving portion receives an external force.

24. The strap structure of claim 23, wherein the driving member is slidably disposed at the case and moves relative to the case when receiving the external force, and the driving member has a sloped surface bearing against the pushing member.

25. The strap structure of claim 24, wherein the switching assembly further comprises at least one second restoring spring connected to the driving member and the case, and the at least one second restoring spring is configured to engage the transmission member with the driven gear in an original state thereof.

* * * * *